United States Patent [19]

Kondo et al.

[11] Patent Number: 5,600,884
[45] Date of Patent: Feb. 11, 1997

[54] METHOD OF MANUFACTURING ELECTRICAL CONNECTING MEMBER

[75] Inventors: Hiroshi Kondo; Tetsuo Yoshizawa, both of Yokohama; Toyohide Miyazaki, Ibaraki-ken; Yoshimi Terayama, Odawara; Takashi Sakaki, Tokyo; Yuichi Ikegami, Osaka; Takahiro Okabayashi, Tokyo; Kazuo Kondo, Tokyo; Yoichi Tamura, Tokyo; Yasuo Nakatsuka, Tokyo, all of Japan

[73] Assignees: Canon Kabushiki Kaisha, Tokyo; Sumitomo Metal Industries, Ltd., Osaka, both of Japan

[21] Appl. No.: 171,862

[22] Filed: Dec. 22, 1993

Related U.S. Application Data

[63] Continuation of Ser. No. 837,932, Feb. 20, 1992, abandoned.

[30] Foreign Application Priority Data

| Feb. 25, 1991 | [JP] | Japan | 3-053904 |
| Feb. 25, 1991 | [JP] | Japan | 3-059306 |
| Mar. 9, 1991 | [JP] | Japan | 3-069091 |
| Mar. 9, 1991 | [JP] | Japan | 3-069092 |

[51] Int. Cl.⁶ .................................................. H01K 3/10
[52] U.S. Cl. ...................... 29/852; 29/429; 29/629; 29/848; 156/307.3; 437/209
[58] Field of Search ................. 29/424, 829, 848, 29/852; 156/307.3; 437/209

[56] References Cited

U.S. PATENT DOCUMENTS

| 3,193,789 | 7/1965 | Brown | 174/262 |
| 4,067,945 | 1/1978 | DuRocher | 264/104 |
| 4,231,811 | 11/1980 | Somekh et al. | 148/1.5 |
| 4,641,222 | 2/1987 | Derfiny | 361/403 |
| 4,766,371 | 8/1988 | Moriya | 439/68 |
| 4,926,549 | 5/1990 | Yoshizawa et al. | 29/876 |
| 4,991,290 | 2/1991 | MacKay | 439/67 |
| 5,013,249 | 5/1991 | Lindeman | 439/75 |
| 5,058,800 | 10/1991 | Yoshizawa et al. | 228/180.2 |
| 5,155,302 | 10/1992 | Nguyen | 361/414 |

FOREIGN PATENT DOCUMENTS

| 0344720 | 12/1989 | European Pat. Off. . |
| 0368262 | 5/1990 | European Pat. Off. . |
| 0425316 | 5/1991 | European Pat. Off. . |
| 2519228 | 7/1983 | France . |
| 2-49385 | 2/1990 | Japan . |

*Primary Examiner*—Carl J. Arbes
*Attorney, Agent, or Firm*—Fitzpatrick, Cella, Harper & Scinto

[57] ABSTRACT

An electrical connecting member, one surface of which is connected to a connecting section of a first electrical circuit member and another surface of which is connected to a connecting section of a second electrical circuit member. The electrical connecting member includes a holding member formed of an electrically insulative member. The holding member has a plurality of recess holes. The connecting member also includes a plurality of electrically conductive members provided in the electrically insulative member, insulated from each other. One end of the electrically conductive members is exposed on one surface of the holding member to be connected to the connecting section of the first electrical circuit member. Another end of the electrically conductive members is exposed on another surface of the holding member to be connected to the connecting section of the second electrical circuit member.

10 Claims, 10 Drawing Sheets

METHOD OF MANUFACTURING ELECTRICAL CONNECTING MEMBER

This application is a continuation of application Ser. No. 07/837,932, filed Feb. 20, 1992, now abandoned.

BACKGROUND OF THE INVENTION

1. Field of the Invention

This invention relates to an electrical connecting member for use when electric circuit parts are electrically connected together and a method of manufacturing the same.

2. Related Background Art

The wire bonding method and the TAB (tape automated bonding) method are known as a method of electrically connecting the electric circuit parts of a printed substrate, an integrated circuit or the like together. However, these methods have both been costly and moreover have suffered from the difficulty that the number of connection points between electric circuit parts is increased and the increase cannot be coped with if the connection point density becomes high.

There is known a technique of electrically connecting electric circuit parts together by the use of an electrical connecting member having a plurality of electrically conductive members provided in a mutually insulated state in an insulative holding member to overcome the above-noted difficulty.

As such an electrical connecting member, there is one proposed in Japanese Laid-Open Patent Application No. 2-49385. This technique will hereinafter be described with reference to FIGS. 1 and 2 of the accompanying drawings.

Figure 1:
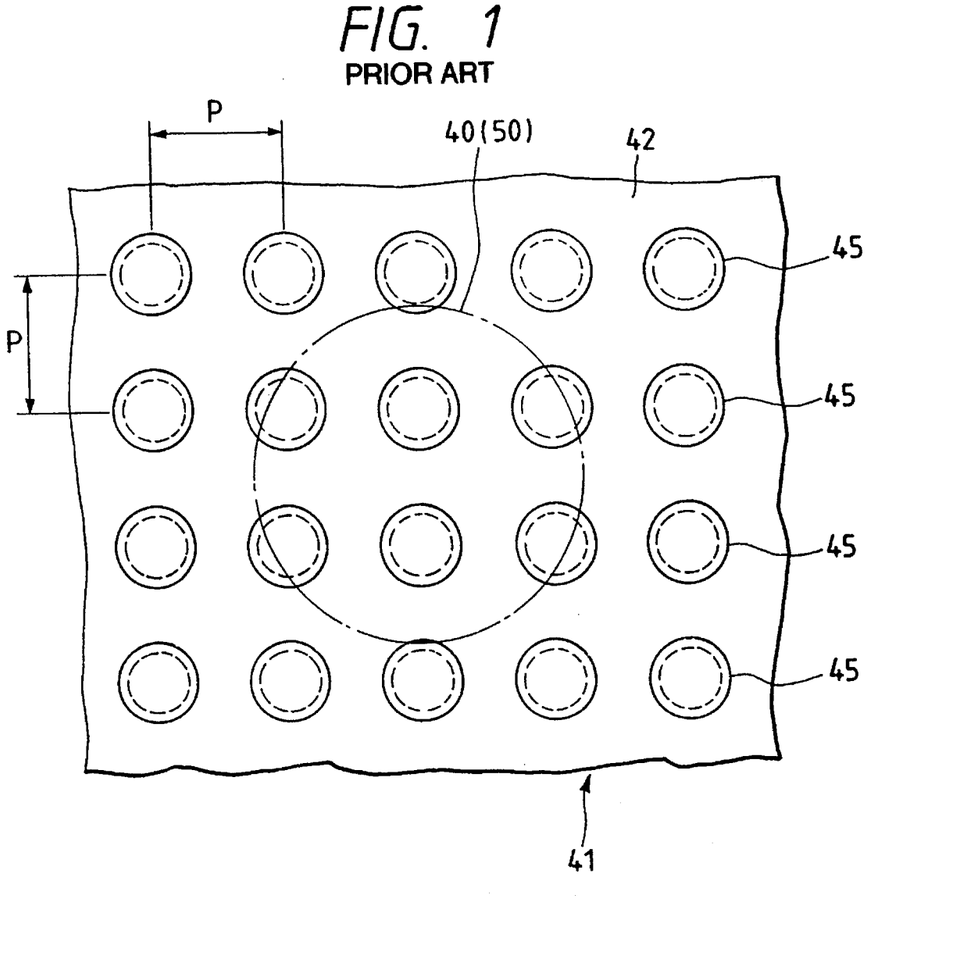
FIG. 1 is a plan view of an electrical connecting member according to the prior art.
Figure 2:
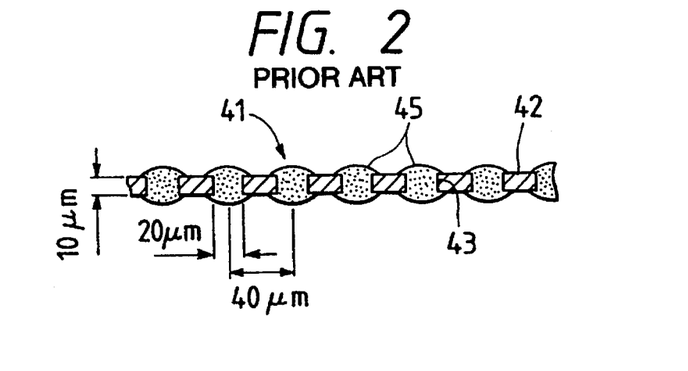
FIG. 2 is a schematic cross-sectional view of the electrical connecting member according to the prior art.

FIG. 1 is a plan view of an electrical connecting member 41 according to the prior art, and FIG. 2 is a longitudinal cross-sectional view thereof. This electrical connecting member 41 is comprised of a film-like holding member 42 formed of an electrically insulative material and a plurality of electrically conductive members 45 provided in a mutually insulated state in apertures 43 formed at predetermined intervals in the holding member 42. One end of each of the electrically conductive members 45 is exposed in such a manner as to slightly protrude on one surface of the holding member 42, and the other end thereof is exposed in such a manner as to slightly protrude on the other surface of the holding member 42, and the diameter of these exposed end portions is slightly larger than the diameter of the apertures 43, and the exposed end portions are stopped from slipping out of the apertures 43.

Figure 3A:
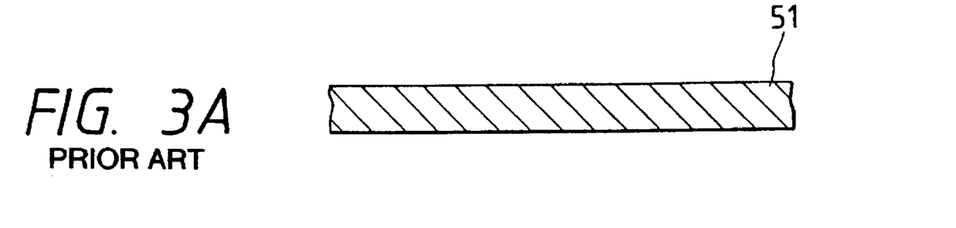
FIGS. 3A to 3E are schematic cross-sectional views showing the essential steps of manufacturing the electrical connecting member according to the prior art.
Figure 3B:
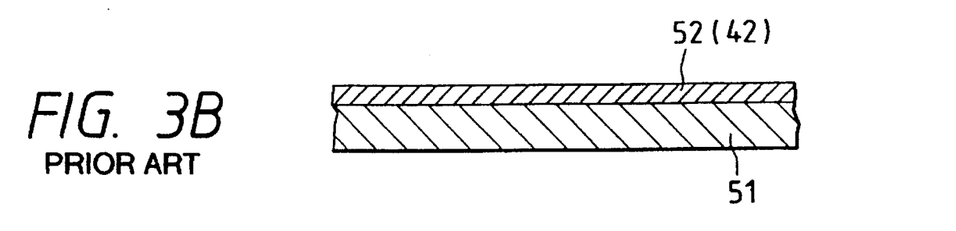
Figure 3C:
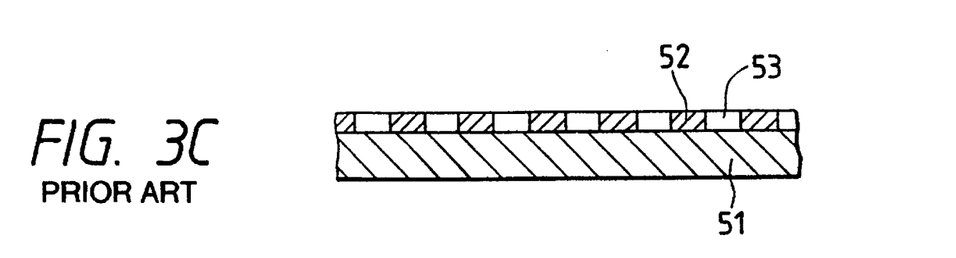
Figure 3D:
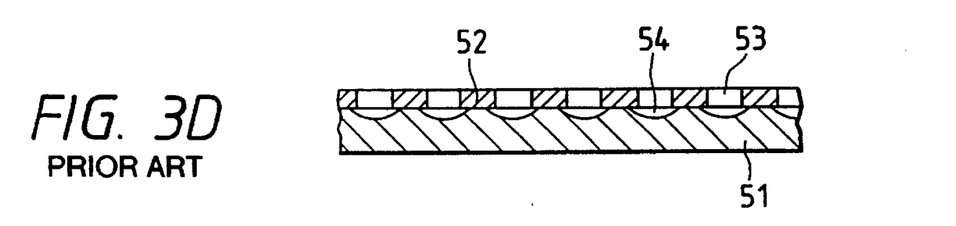
Figure 3E:
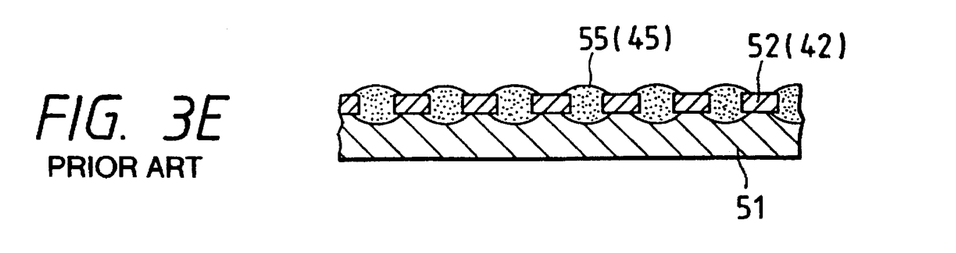
Figure 4A:
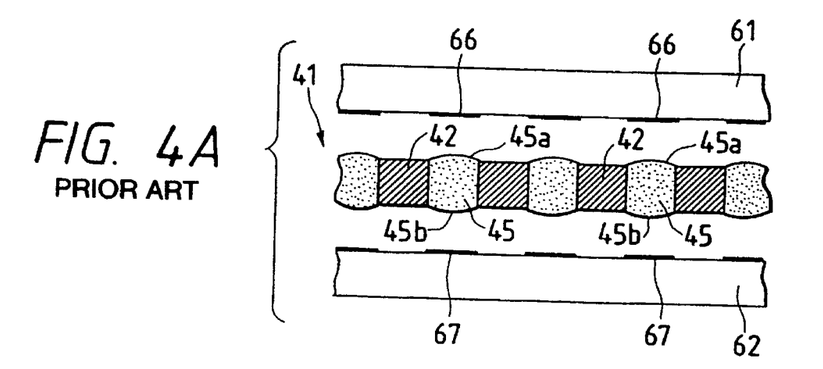
FIGS. 4A and 4B are illustrations showing the popular mode of use of the electrical connecting member.
Figure 4B:
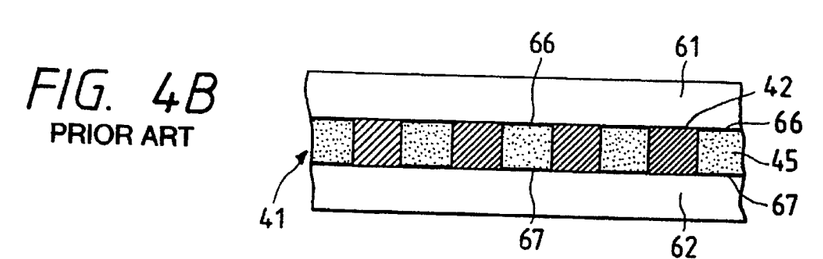

As regards the dimensions of the various portions of the electrical connecting member 41, as shown in FIG. 4 of the accompanying drawings, the thickness of the holding member 42 is about 10 µm, the diameter of each aperture 43 (the post-like portion of the electrically conductive member) is about 20 µm, the pitch between the apertures 43 is about 40 µm, and the height of protrusion of each electrically conductive member 45 on each of the front and back surfaces of the holding member is of the order of several µm. Such an electrical connecting member is manufactured by a process as shown in FIGS. 3A to 3E of the accompanying drawings.

FIGS. 3A to 3E are schematic cross-sectional views showing the essential steps of a method of manufacturing the electrical connecting member according to the prior art. A metal sheet 51 which provides a base body is first prepared (FIG. 3A), and negative-type photosensitive resin 52 constituting the holding member 42 is applied onto the metal sheet 51 by a spinner and is pre-baked (FIG. 3B). Light is applied to the photosensitive resin 52 through a photomask (not shown) which forms a predetermined pattern to thereby expose the photosensitive resin 52 to the light, and development is effected (FIG. 3C). Thereby, the photosensitive resin 52 remains on the exposed portion, and in the unexposed portion, the photosensitive resin 52 is removed by the developing process, and apertures 53 in which the surface of the metal sheet is exposed on the bottom are formed. Temperature is increased to thereby effect the curing of the photosensitive resin 52, whereafter these are immersed in etching liquid to thereby expose each the surface of the metal sheet 51 in the apertures 53, and recesses 54 are formed there (FIG. 3D).

The apertures 53 and the recesses 54 are then filled with gold 55 constituting the electrically conductive members 54, and the electrically conductive members 45 are gold-plated so as to be protuberant to a predetermined height from the surface of the photosensitive resin 52, thereby forming bumps (FIG. 3E). Finally, the metal sheet 51 is removed by etching, whereby the electrical connecting member 41 in which the gold 55 and the photosensitive resin 52 constitute the electrically conductive members 45 and the holding member 42, respectively, as shown in FIG. 2, is manufactured.

FIG. 4A of the accompanying drawings is a schematic view showing electric circuit parts 61, 62 and the electrical connecting member 41 before they are connected together, and FIG. 4B of the accompanying drawings is a schematic view showing the electric circuit parts 61, 62 and the electrical connecting member 41 after they are connected together. The electric circuit parts 61 and 62 are those of a printed substrate or the like which are to be connected together. One electric circuit part 61 is opposed to that side of the electrical connecting member 41 on which one end 45a of each electrically conductive member 45 is exposed, and the other electric circuit part 62 is opposed to that side of the electrical connecting member 41 on which the other end 45b of each electrically conductive member 45 is exposed (FIG. 4A). The connecting portions 66 and 67 of the electric circuit parts 61 and 62, respectively, and the ends 45a and 45b of the electrically conductive members 45 are brought into pressure contact with each other while being heated and are made into an alloy, whereby they are connected together.

Now, when the electrical connecting member 41 as described above is used for the connection of the electric circuit parts, the holding member 42 of polyimide resin or the like still remains around the electrically conductive members 45 after the connection. Accordingly, there is the problem that if a temperature change occurs after the connection and the holding member 42 is thermally expanded, strong stress will be imparted to the electrically conductive members 45 by the expanded holding member 42, whereby the electrically conductive members 45 may be damaged or severed.

Further, in the electrical connecting member 41 as described above, the concentration of stress may be caused in the electrically conductive members 45 and the joint portions of these to electrodes 40, 50 by the actions of the forces in directions other than the direction of pressure contact during the pressure contact of the electrodes 40, 50 and the action of the thermal stress after the connection, and in such case, there is the problem that cracks occur in the electrically conductive members 45, the joint portions and the holding member 42 and when the concentration of heavy stress occurs, the electrically conductive members 45 or the holding member 42 may be fractured to cause an increase in electrical resistance and unsatisfactory conduction.

SUMMARY OF THE INVENTION

It is an object of the present invention to provide an electrical connecting member capable of connecting electric circuit parts together well and a method of manufacturing the same.

It is another object of the present invention to provide an electrical connecting member designed so as to be capable of reducing stress given to electrically conductive members by a holding member and a method of manufacturing the same.

It is still another object of the present invention to provide a method of manufacturing an electrical connecting member provided with recesses in a holding member very easily by providing light intercepting portions of different diameters in regions wherein apertures are formed and regions wherein recesses are formed and effecting an exposure process, thereby simply using a single-layer photomask.

It is yet still another object of the present invention to provide an electrical connecting member which can be realized with the lower limit of the interval between electrically conductive members remaining maintained and which can effectively eliminate the occurrence of an increase in electrical resistance and unsatisfactory conduction caused by a holding member being cracked or fractured as a result of the concentration of stress to the electrically conductive members, and a method of manufacturing the same.

It is a further object of the present invention to provide an electrical connecting member in which the expansion of the volume of a holding member resulting from thermal expansion is absorbed by concave holes and unnecessary stress can be prevented from being applied to electrically conductive members, and a method of manufacturing the same.

It is still a further object of the present invention to provide an electrical connecting member in which any increase in volume resulting from thermal expansion can be absorbed by through-holes, and a method of manufacturing the same.

DESCRIPTION OF THE PREFERRED EMBODIMENTS

The present invention will hereinafter be specifically described with reference to the drawings showing some embodiments thereof.

First Embodiment

Figure 5:
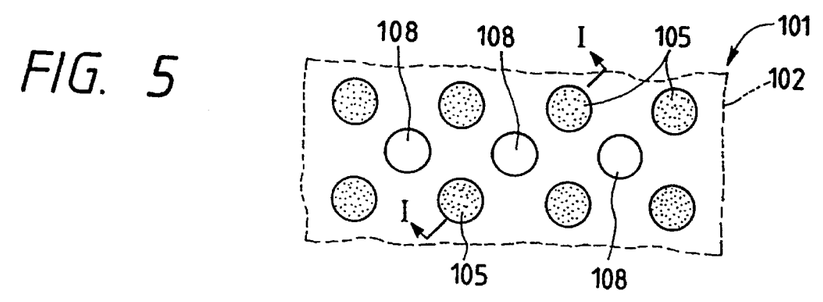
FIG. 5 is a fragmentary plan view showing an electrical connecting member according to a first embodiment of the present invention.
Figure 6:
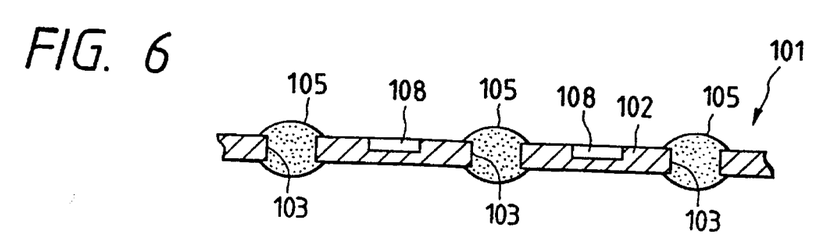
FIG. 6 is a cross-sectional view taken along the line I—I of FIG. 5.

FIG. 5 is a fragmentary plan view of an electrical connecting member according to a first embodiment of the present invention, and FIG. 6 is an enlarged longitudinal sectional view taken along the line I—I of FIG. 5. In these figures, the reference numeral 102 designates a holding member formed of photosensitive resin such as photosensitive polyimide resin. This holding member 102 has electrically conductive members 105 of gold or the like provided in an insulated state in a plurality of through-apertures 103 formed at predetermined intervals in the longitudinal and lateral directions thereof, and concave holes 108 are formed in the holding member 102 between the electrically conductive members 105.

Each electrically conductive member 105 extends through the holding member 102, and one end thereof slightly protrudes and is exposed on one surface of the holding member 102 and the other end thereof slightly protrudes and is exposed on the other surface of the holding member 102. Also, each concave hole 108 is formed in the substantially central portion between adjacent electrically conductive members 105.

The size, depth, cross-sectional shape and shape as viewed in a plan view of each concave hole 108 are not particularly restricted, but may be any ones which can absorb the dilation of the holding member 102 attributable to the difference in thermal expansion between the holding member 102 and the electrically conductive members 105 and mitigate or eliminate stress acting on the electrically conductive members 105.

An example of a method of manufacturing such an electrical connecting member 101 will hereinafter be described. FIGS. 7A to 7F are schematic cross-sectional views showing the essential steps of manufacturing the electrical connecting member according to the present embodiment.

Figure 7A:
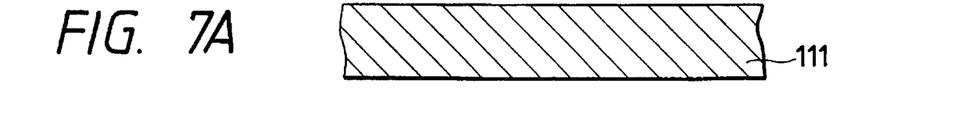
FIGS. 7A to 7F are schematic cross-sectional views showing the essential steps of manufacturing the electrical connecting member according to the first embodiment of the present invention.
Figure 7B:
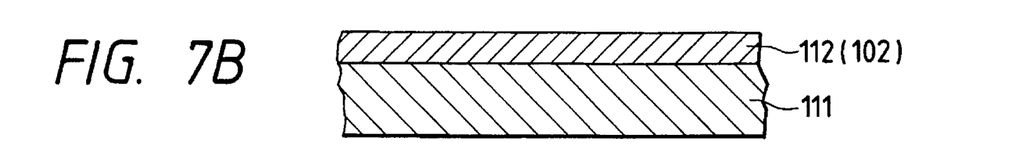
Figure 7C:
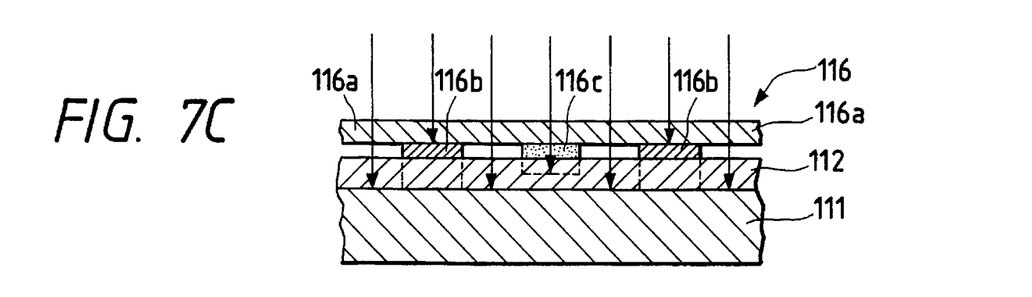

Basically, for example, a copper plate 111 having tungsten (W) film formed in layers on the surface thereof is first prepared (FIG. 7A), resist 112 for constituting the holding member 102 is applied onto the copper plate 111 and is pre-baked (FIG. 7B), whereafter this is exposed to light (FIG. 7C). As a mask 116 for use during this exposure, use is made of a mask having 100% light intercepting areas 116b which are formed of Cr film or the like and light attenuating areas 116c which use a Cr or ND filter formed on one surface of a mask base material 116a. Thus, when light is applied with the mask 116 superposed on the resist 112, the resist 112 in the portions opposed to the light intercepting areas 116b of the mask 116 is not exposed to the light and the resist 112 in the portions opposed to the light attenuating areas 116c is exposed to the light to a depth corresponding to the amount of light attenuation, and the other portions are light transmitting areas and are exposed to the light.

Figure 7D:
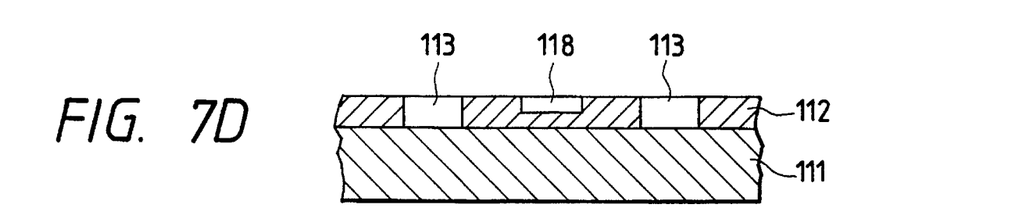
Figure 7E:
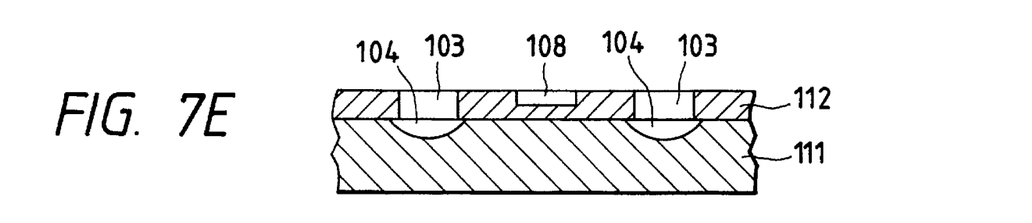
Figure 7F:
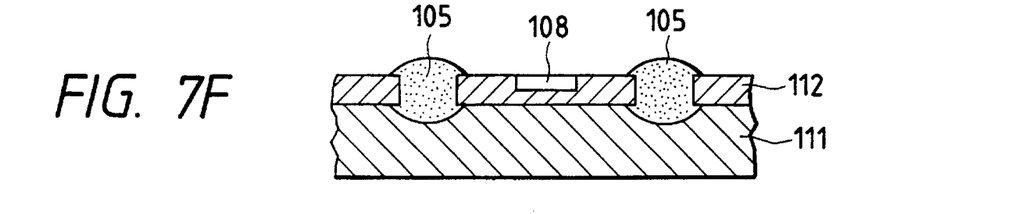

Accordingly, when the resist 112 exposed to the light by the use of such a mask 116 is developed, apertures 103 through which the W film on the surface of the copper plate 111 is exposed at the bottom are formed in the portions opposed to the light intercepting areas 116b and concave holes 108 are formed in the portions opposed to the light attenuating areas 116c (FIG. 7D). Subsequently, portions of the copper plate 111 which are exposed in the apertures 103 are removed by etching to thereby form recesses 104 (FIG. 7E), whereafter gold plating is applied with the copper plate 111 as an electrode, and the apertures 103 and recesses 104 are filled, for example, with gold which is the electrically conductive members 105 and the surface of the gold is made protuberant until it becomes slightly higher than the surface of the resist 112 (FIG. 7F).

Thereafter, the copper plate 111 is selectively etched to remove it, whereby there is obtained the electrical connecting member 101 as shown in FIG. 6.

As described above, in the present embodiment, one or more concave holes are formed in the holding member in which the electrically conductive members are provided and therefore, the stress the material of the holding member gives to the electrically conductive members by being expanded out toward the interior of the hole or holes when the temperature of the holding member becomes high enough to cause the thermal expansion of the holding member is mitigated and the damage or fracture of the electrically conductive members can be reliably prevented and further, when as shown in FIG. 4, the electrically conductive members of the electrical connecting member and the connecting portions of other electric circuit parts are brought into pressure contact with each other, the force applied to the holding member through the electrically conductive members is effectively dispersed, whereby connection can be accomplished by low pressure and thus, the present embodiment achieves an excellent effect.

Second Embodiment

Figure 8A:
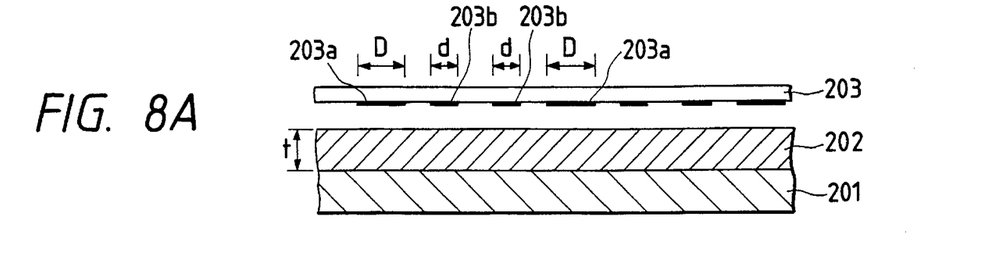
FIGS. 8A to 8E are schematic cross-sectional views showing the steps of a method of manufacturing an electrical connecting member according to a second embodiment of the present invention.

FIGS. 8A to 8E are schematic cross-sectional views showing the steps of manufacturing a second embodiment of the present invention. Negative type polyimide resin 202 which is photosensitive resin is first applied onto a copper plate 201 which is a base body by a spin coater and is pre-baked, whereafter light (not shown) is applied thereto through a photomask 203 forming a predetermined pattern, whereby the polyimide resin 202 is exposed to the light (FIG. 8A). The film thickness of the polyimide resin 202 applied is made greater than the desired film thickness of the holding member in an electrical connecting member to be manufactured, with a decrease by curing and shrinkage taken into account.

The light intercepting pattern of the photomask 203 will be described here. The light intercepting pattern of the photomask 203 is comprised of first light intercepting portions 203a each having a diameter D and second light intercepting portions 203b each having a diameter d(LD).

The diameter D is set so that openings can be formed in the polyimide resin 202 having a film thickness t, and the diameter d is set so that openings cannot be formed in the polyimide resin 202.

Figure 8B:
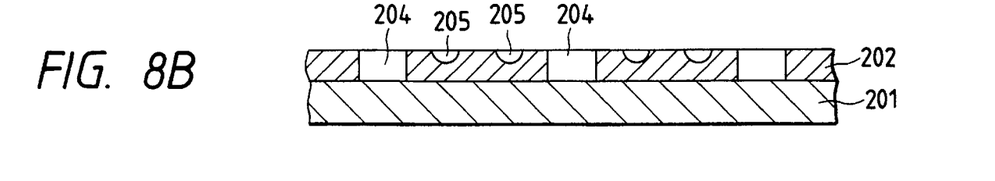

Subsequently, developing liquid is injected to the polyimide resin to thereby effect development. In the present embodiment, the polyimide resin 202 remains on the portions exposed to the light, and the polyimide resin 202 is removed from the portions not exposed to the light by the developing process. Apertures 204 which reach the copper plate 201 are formed in the portions shielded from the light by the first light intercepting portions 203a, and recesses 205 which do not reach the copper plate 201 are formed in the portions shielded from the light by the second light intercepting portions 203b (FIG. 8B).

An example of the diameter and depth of the recesses and the exposure and development conditions in the above-described process will now be described.

The film thickness t of the polyimide resin 202 is 9–10 µm, the exposure amount is 750 mJ/cm$^2$, and the development conditions are such that the injection development time is 6 minutes and the injection rinse time is 1 minute. In such a case, when the diameter of the recesses is 8 µm, the depth thereof is 6 µm, and when the diameter of the recesses is 6 µm, the depth thereof is 3 µm.

Figure 8C:
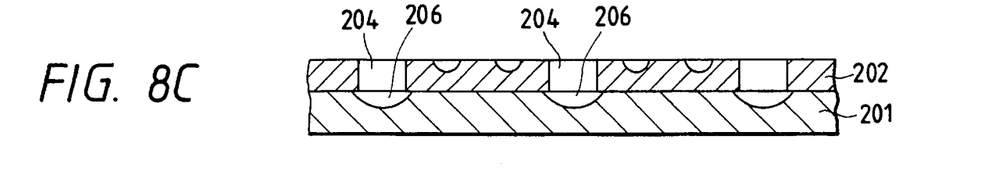

Subsequently, the curing of the polyimide resin 202 is effected, whereafter the copper plate 201 is immersed in etching liquid to etch the copper plate 201, whereby the portions of the copper plate 201 which are near the apertures 204 are removed by etching and recesses 206 communicating with the apertures 204 are formed in the copper plate 201 (FIG. 8C). It is to be understood that the diameter of the recesses 206 formed at this time is larger than the diameter of the apertures 204 and smaller than a half of the distance to the outer periphery of the adjacent aperture 204. By the size of the recesses 206 being thus controlled, there can be manufactured an electrical connecting member in which adjacent electrically conductive members do not conduct to each other and moreover the electrically conductive members do not slip out.

Figure 8D:
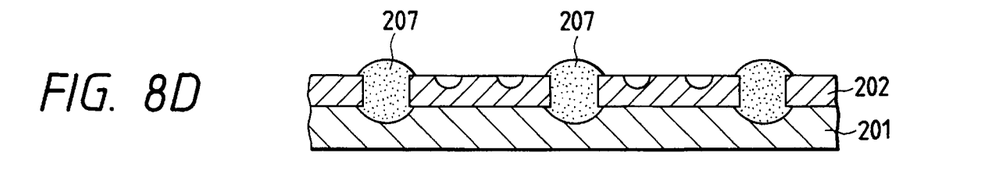
Figure 8E:
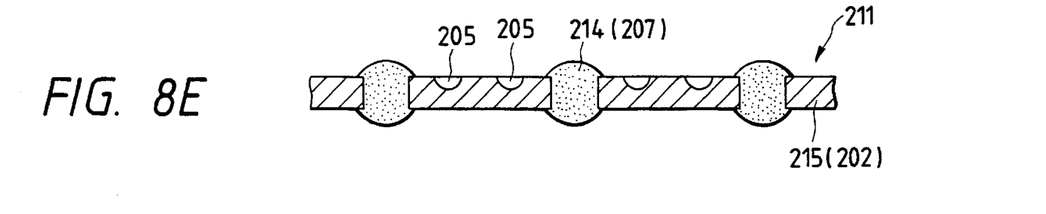

Then, the apertures 204 and the recesses 206 are filled with gold 207 by gold plating used with the copper plate 201 as a common electrode, and the gold plating is continued until the gold 207 protrudes from the surface of the polyimide resin 202 (FIG. 8D). The copper plate 201 is removed by metal etching by the use of etching liquid which etches copper but does not etch gold and polyimide resin, whereby an electrical connecting member 211 is manufactured (FIG. 8E).

In the electrical connecting member 211 manufactured in this manner, the gold 207 constitutes electrically conductive members 214 and the polyimide resin 202 constitutes a holding member 215, and a plurality of recesses 205 are provided in the surface of the holding member 215. The size and formation pitch of the electrically conductive members 214 in the thus manufactured electrical connecting member 211 are the same as those in the prior art.

The number, diameter and depth of the recesses 205 formed between adjacent apertures 204 shown in the above-described manufacturing process are merely examples and of course, these may be set arbitrarily.

As described in detail above, in the manufacturing method of the present embodiment, the exposure process of the photosensitive resin is carried out by the use of the photomask having the first light intercepting portions and the second light intercepting portions differing in diameter from each other and therefore, a plurality of recesses can be easily formed in the photosensitive resin after the developing step, and there can be manufactured an electrical connecting member having recesses for absorbing the thermal expansion of the holding member provided in the holding member, and there can be provided an electrical connecting member which is high in reliability when electric circuit parts are electrically connected together, and thus, the present embodiment achieves an excellent effect.

Third Embodiment

Figure 9:
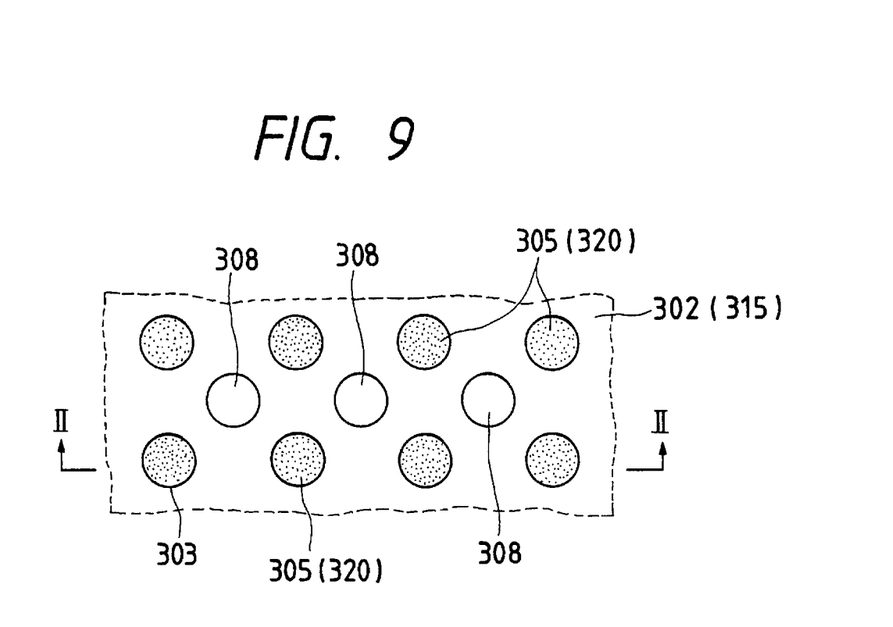
FIG. 9 is a fragmentary plan view of an electrical connecting member according to a third embodiment of the present invention.
Figure 10:
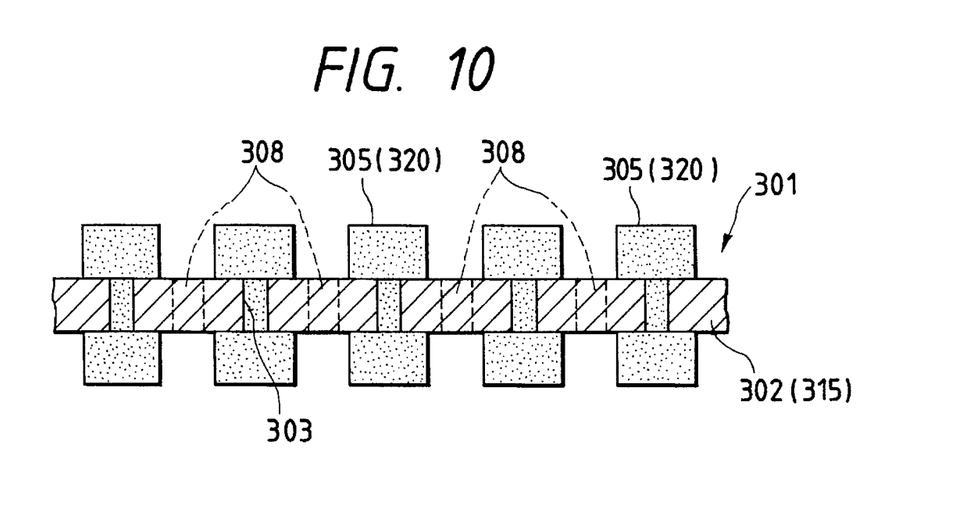
FIG. 10 is a cross-sectional view taken along the line II—II of FIG. 9.

FIG. 9 is a fragmentary plan view of an electrical connecting member according to a third embodiment of the present invention, and FIG. 10 is a longitudinal sectional view taken along the line II—II of FIG. 9. In these figures, the reference numeral 302 designates a holding member formed of polyimide film or the like. This holding member 302 has electrically conductive members 305 provided in a mutually insulated state in a plurality of apertures 303 formed at predetermined intervals in the longitudinal and lateral directions of the holding member, and a plurality of through-holes 308 are formed in the holding member 302 between the electrically conductive member 305.

Each electrically conductive member 305 extends through the holding member 302, and one end thereof slightly protrudes and exposed on one surface of the holding member 302 and the other end thereof slightly protrudes and exposed on the other surface of the holding member 302. Each through hole 308 is formed in the substantially central portion between adjacent electrically conductive members 305.

The size, cross-sectional shape and shape as viewed in a plan view of each through-hole 308 are not particularly restricted, but may be any ones which can absorb the dilation of the holding member 302 attributable to the difference in thermal expansion between the holding member 302 and the electrically conductive members 305 and can mitigate or eliminate stress acting on the electrically conductive members 305.

The method of manufacturing such an electrical connecting member is not particularly restricted, and an example thereof will be described below.

Figure 11A:
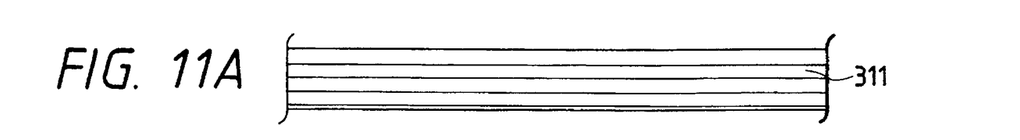
FIGS. 11A to 11E are schematic cross-sectional views showing the essential steps of manufacturing the electrical connecting member according to the third embodiment of the present invention.
Figure 11B:
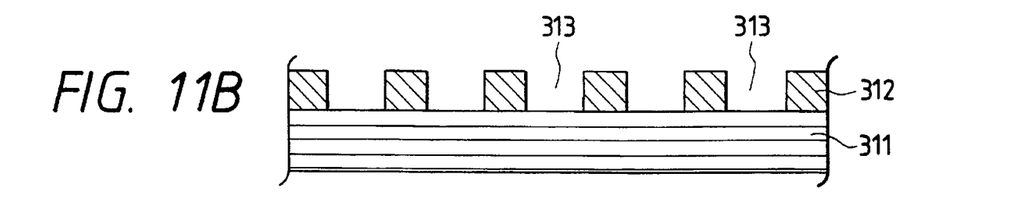
Figure 11C:
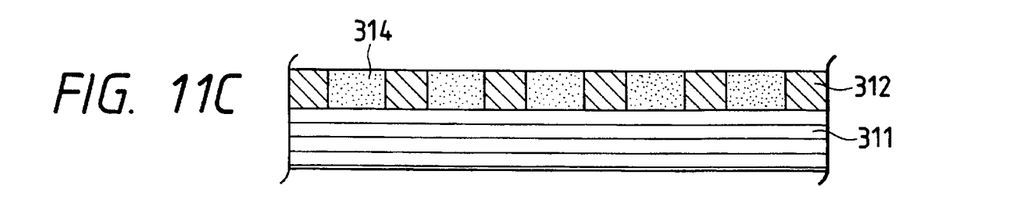

FIGS. 11A to 11E, 12A to 12E, 13A and 13B are schematic cross-sectional views showing the essential steps of manufacturing the electrical connecting member according to the present embodiment. A copper plate 311 comprising, for example, tungsten (W) film formed in layers on the surface thereof is prepared as a base body (FIG. 11A), and resist 312 is applied onto this copper plate 311 and pre-baked, whereafter exposure and development are effected to thereby form apertures 313 in which the W film on the surface of the copper plate 311 is exposed at the bottom, and the resist 312 is hard-pre-baked (FIG. 11B).

Figure 11D:
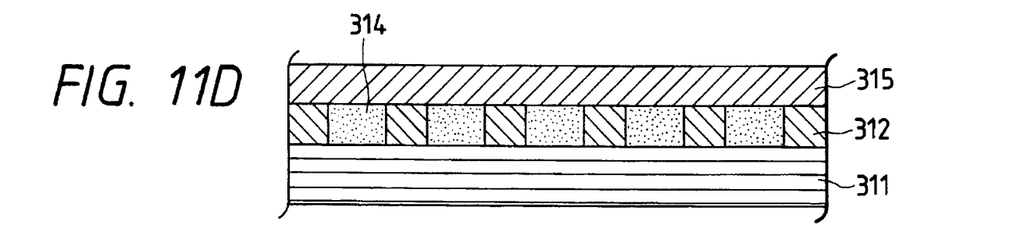
Figure 11E:
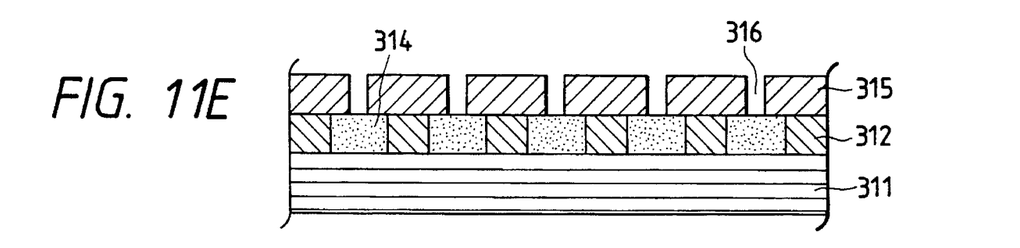

Each aperture 313 is filled, for example, with gold 314 which is the electrically conductive member with the copper plate 311 as an electrode and gold plating is applied until the surface of the gold 314 becomes flush with the surface of the resist 312 (FIG. 11C), and photosensitive resin 315 forming the insulative holding member, for example, polyimide resin, is applied to the surface of the resist 312 and the surface of the gold 314 to a uniform thickness and is pre-baked (FIG. 11D). The photosensitive resin 315 is exposed to light and developed to thereby form apertures 316 which are smaller than the diameter of the gold 314 and in which the surface of the gold 314 is exposed at the bottom in the substantially central portions of locations corresponding to the gold 314 (FIG. 11E), and pre-baking is effected to cure the photosensitive resin 315.

Figure 12A:
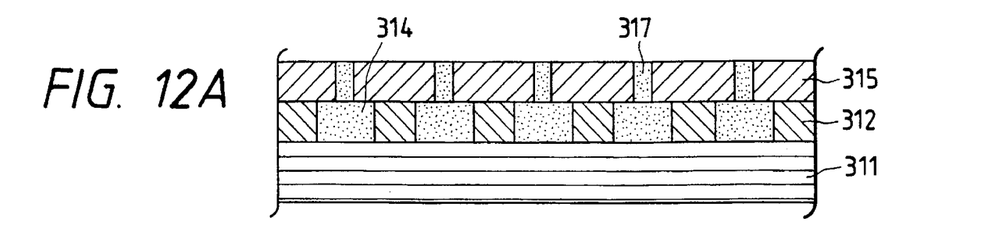
FIGS. 12A to 12E are schematic cross-sectional views showing the essential steps of manufacturing the electrical connecting member according to the third embodiment of the present invention.
Figure 12B:
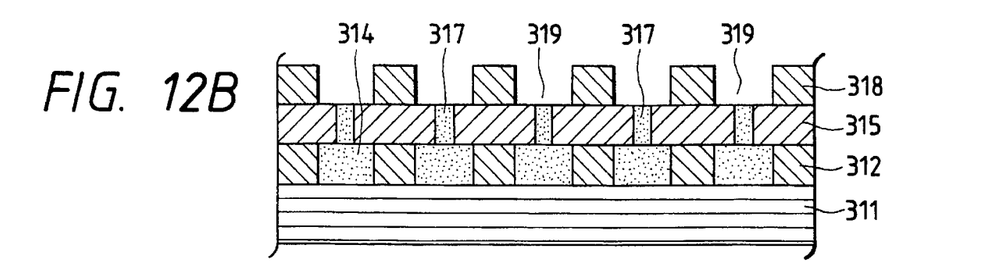
Figure 12C:
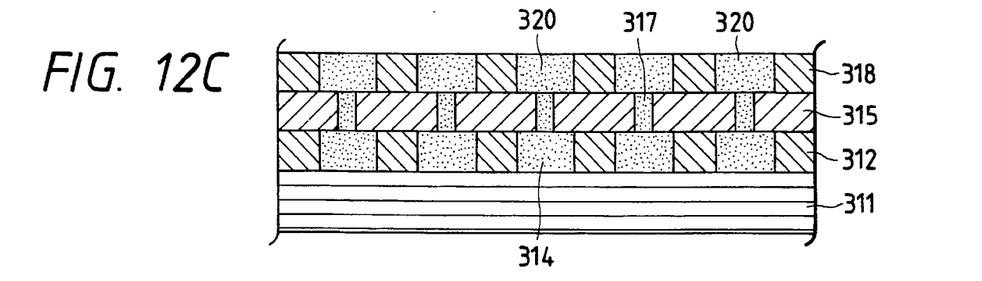
Figure 12D:
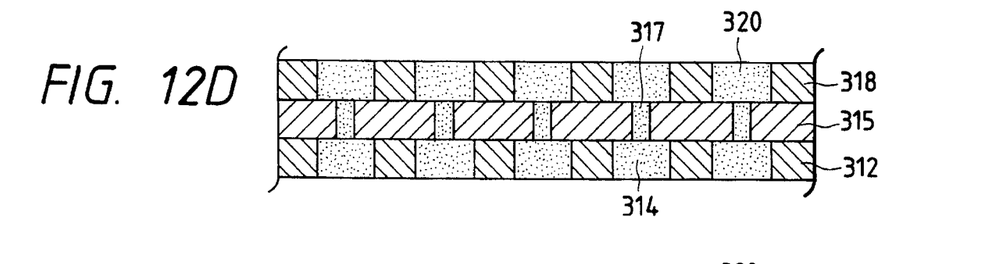
Figure 12E:
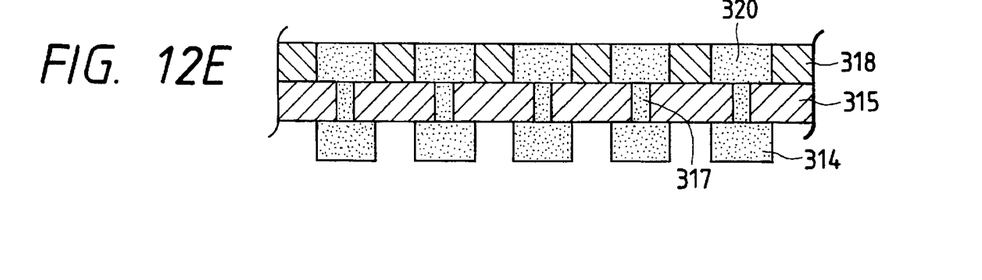

Subsequently, with the gold 314 on the copper plate 311 as an electrode, each aperture 316 is filled, for example, with gold 317 which is an electrically conductive member and gold plating is applied until the surface of the gold 317 becomes flush with the surface of the photosensitive resin 315 (FIG. 12A), and resist 318 is applied uniformly to the surface of the photosensitive resin 315 and the surface of the gold 317 and is pre-baked, whereafter exposure and development are effected to thereby form apertures 319 which are substantially equal in size to the diameter of the gold 314 and in which the gold 317 and part of the photosensitive resin 315 are exposed at the bottom at locations corresponding to the gold 317 (FIG. 12B). With the gold 314 on the copper plate 311 and the gold 317 as electrodes, each aperture is filled with gold 320 which is an electrically conductive member and gold plating is applied until the surface of the gold 320 becomes flush with the surface of the resist 318 (FIG. 12C).

Figure 13A:
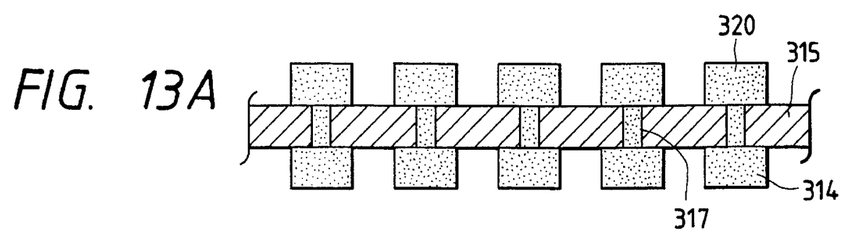
FIGS. 13A and 13B are schematic cross-sectional views showing the essential steps of manufacturing the electrical connecting member according to the third embodiment of the present invention.
Figure 13B:
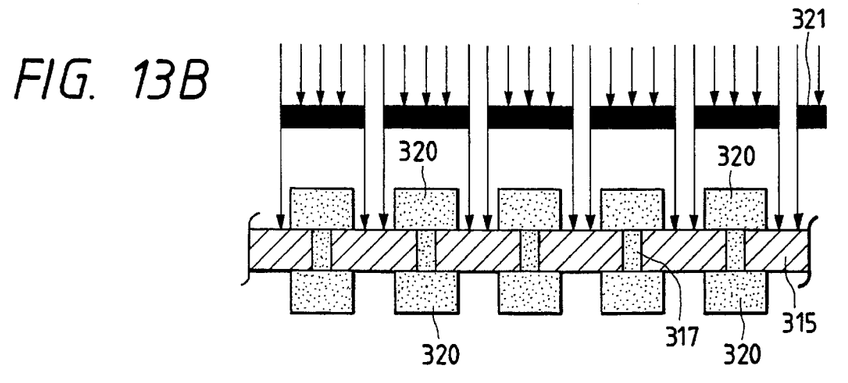

Thereafter, the copper plate 301 is first selectively etched to remove it (FIG. 12D), and then the pre-baked resist 312 is removed by ashing using $O_2$ plasma (FIG. 12E), and the resist 318 is removed by resist removing liquid (FIG. 13A).

The order of these removing steps is arbitrary and for example, the resist 318 may be first removed by the use of resist removing liquid, whereafter the copper plate 311 may be etched and the resist 312 may be removed by ashing using $O_2$ plasma. Subsequently, a high energy beam is projected onto the photosensitive resin 315 in the portions wherein the electrically conductive members are absent by the use of a mask 321 (FIG. 13B), whereby the through-holes 308 as shown in FIGS. 9 and 10 are formed there, whereby there is manufactured an electrical connecting member in which the gold 314, 317, 320 constitutes the electrically conductive material 305 and the photosensitive resin 315 constitutes the holding member 302. Concave holes may simply be provided instead of the through-holes 308.

In such an embodiment, a bump has its expanse in the lateral direction restricted by the apertures 313 and 319 formed in the resists 312 and 318 and thus, a convenience such as the contact of adjacent electrically conductive members with each other can be prevented, and by suitably setting the thicknesses of the regists 312 and 318, it becomes possible to set the height of protrusion of the electrically conductive members from the holding member arbitrarily.

As described above, in the present embodiment, one or more holes are formed in the holding member in which the electrically conductive members are provided and therefore, when the temperature of the holding member becomes high and the holding member is thermally expanded, the material of the holding member swells out toward the interior of the holes and therefore the stress given to the electrically conductive members is liberated, whereby the damage or fracture of the electrically conductive members can be reliably prevented and further, the force applied to the holding member through the electrically conductive members is effectively dispersed and the connection of the connecting member can be accomplished by low pressure and thus, the present embodiment achieves an excellent effect.

Fourth Embodiment

In this embodiment, electrically conductive members on the surface of a holding member are disposed in a staggered fashion to thereby achieve an arrangement of higher density than in the case where they are disposed in longitudinal and lateral rows, whereby the number of electrically conductive members joined to the electrodes of electric circuit parts is increased and the degree of concentration of stress in the electrically conductive members is alleviated to thereby prevent the occurrence of a crack or fracture of the holding member and eliminate the problems of an increase in electrical resistance and unsatisfactory conduction when the electric circuit parts are connected together.

Generally, there is a limit in making the electrically conductive members 403 minute and also, there is a limit in reducing the aforementioned P dimensions, in order to maintain the insulated state between adjacent electrically conductive members 403, and in practice, the lower limit of the diameter of each electrically conductive member 403 is of the order of 10 µm and the lower limit of the P dimensions when the electrically conductive members 402 is of the order of 20 µm.

The electrical connecting member 401 according to the present embodiment, as viewed in a cross-sectional view, has a construction similar to that of the prior art shown in FIG. 2, and the connection of electric circuit parts by the electrical connecting member 401 according to the present embodiment is also effected just in the same manner as in the prior art as shown in FIG. 4.

Figure 14:
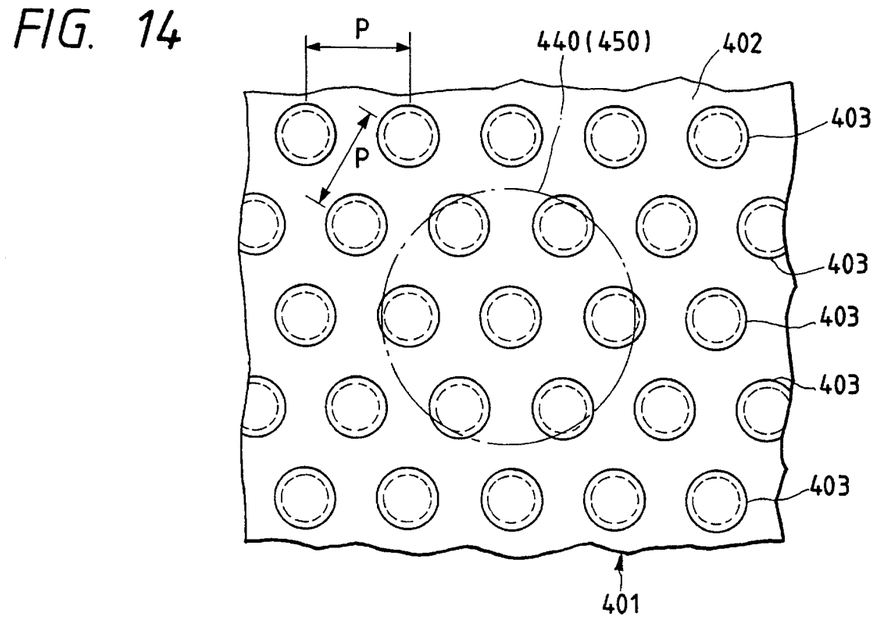
FIG. 14 is a plan view of an electrical connecting member according to a fourth embodiment of the present invention.
Figure 15:
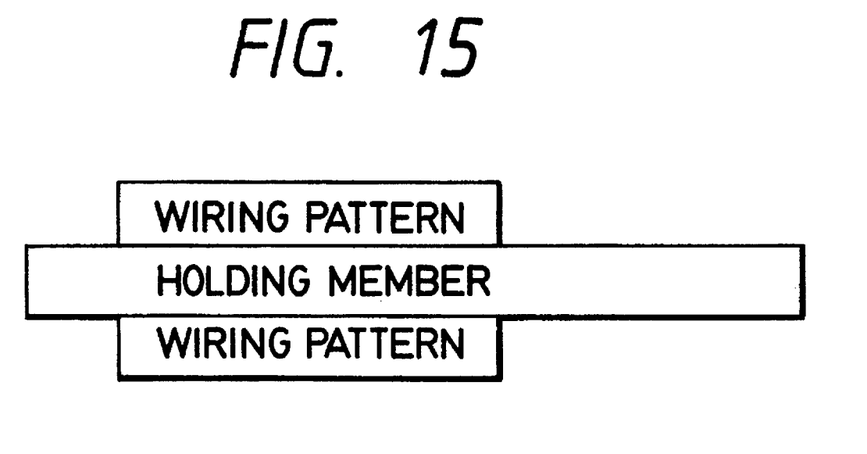
FIG. 15 is a schematic view of a wiring pattern formed on each surface of a holding member.

The feature of the electrical connecting member 401 according to the present embodiment is that as is clear from the plan view of FIG. 14, the electrically conductive members 403 on the surface of the holding member 402, unlike those in the prior art, are disposed in a staggered fashion.

In FIG. 14 and FIG. 1, which show the arrangement of the prior-art electrically conductive members 45, the portions of the holding members having substantially equal areas are cut out and the diametrical dimensions of the electrically conductive members and the intervals (P dimensions) between the electrically conductive members are shown as being substantially equal. When these two figures are compared with each other, in FIG. 1, the number of the electrically conductive members appearing in the figure is 20, whereas in FIG. 14, the number of the electrically conductive members completely contained in the figure is 23 and the number of the electrically conductive members incompletely contained in the figure is 4 and thus, 27 electrically conductive members 403 in total appear in the figure. From this, it is seen that in the electrical connecting member 401 according to the present embodiment, if the diametrical dimensions of the electrically conductive members 403 and the aforementioned P dimensions are common, greatly higher density of the electrically conductive members 403 than in the prior art becomes possible.

The diametrical dimensions of the electrically conductive members 403 are determined by the formation accuracy of the pattern on the photomask used during the exposure of polyimide resin 411 in the aforedescribed manufacturing process, and the aforementioned P dimensions are determined from the viewpoint of the maintenance of the insulated state between adjacent electrically conductive members 403, and these conditions are invariable irrespective of the mode of arrangement of the electrically conductive members 403. Accordingly, in the electrical connecting member 401 according to the present embodiment, the arrangement of the electrically conductive members 403 at greatly higher density than in the prior art becomes possible.

Also, in FIG. 14, electrodes 440, 450 which are the objects of connection are shown to have the same dimensions as in FIG. 1. When these two figures are compared with each other, it will be seen that in FIG. 1, the electrodes 40, 50 can contact with only six electrically conductive members 45 at most, including incomplete ones, whereas in FIG. 14, substantially complete contact with as many as seven electrically conductive members 403 takes place. Thus, the degree of concentration of stress in the respective electrically conductive members 403 is alleviated and the possibility of a crack or a fracture occurring in the electrically conductive members 403 and the holding member 402 during the pressure contact of the electrodes 440, 450 is reduced, and the problems of the resultant increase in electrical resistance and unsatisfactory conduction are effectively eliminated. Also, when connection is effected normally, electrical conduction takes place through a greater number of electrically conductive members 403 in the electrical connecting member 401 according to the present embodiment than in the prior art and therefore, the electrical resistance in the connected portions is reduced and a good conductive state is obtained.

As described in detail above, in the electrical connecting member according to the present embodiment, the electrically conductive members are disposed in a staggered fashion on the surface of the holding member and therefore, the number of electrically conductive members disposed per unit area can be greatly increased as compared with the prior art, and during the pressure contact of electric circuit parts, the degree of concentration of stress in each electrically conductive member is alleviated and the possibility of the occurrence of an increase in electrical resistance and unsatisfactory conduction attributable to a crack or a fracture caused in the electrically conductive members and the holding member is effectively eliminated and thus, the present embodiment achieves an excellent effect.

The embodiment described with respect to the construction in which the copper plate 11 having W film formed on the surface thereof is used as the base body is not restrictive, but instead of W, conductive members such as Mo and Ni may be heated and alloyed, or use may be made of a high melting point metal which does not produce a metal-to-metal compound with gold which is electrically conductive member.

Also, in the embodiments shown as using photosensitive polyimide resin as the holding member which is an electrically insulative material, use may also be made of a photosensitive resin, a thermosetting resin or film thereof, other insulative epoxy resins, or a silicone resin or film of these. Also, one or more of inorganic material, a metal material and an alloy material which are in a desired form such as a powder, a fiber, a plate-like body, a bar-like body or a spherical body may be dispersed and contained in these resins. As the metal material and alloy material contained, mention-may be made of Au, Ag, Cu, Al, Be, Ca, Mg, Mo, Fe, Ni, Co, Mn, W, Cr, Nb, Zr, Ti, Ta, Zn, Sn, Pb-Sn or the like, and as the inorganic material contained, mention may be made of ceramics such as $SiO_2$, $B_2O_3$, $Al_2O_3$, $Na_2O$, $K_2O$, $CaO$, $ZnO$, $BaO$, $PbO$, $Sb_2O_3$, $As_2O_3$, $La_2O_3$, $ZrO_2$, $P_2O_5$, $TiO_2$, $MgO$, $SiC$, $BeO$, $BP$, $BN$, $AlN$, $B_4C$, $TaC$, $TiB_2$, $CrB_2$, $TiN$, $Si_3N_4$ or $Ta_2O_5$, diamond, glass, carbon, boron or the like.

Also, in the embodiments described as using an excimer laser beam as the high energy beam, $Co_2$, YAG, $N_2$, Ar or Kr laser beam may be used instead of the excimer laser beam. Also, an ion beam of FIBE, IBE, sputter or the like may be used instead of the laser beam.

Further, gold is used as the material of the electrically conductive members, but alternatively, use may be made of a metal such as Cu, Ag, Be, Ca, Mg, Mo, Ni, W, Fe, Ti, In, Ta, Zn, Al, Sn or Pb-Sn, or an alloy of these. The cross-sectional shape of the electrically conductive members may be circular, square or other shape, but to avoid the excessive concentration of stress, shapes having no angles are desirable.

Also, in each of the above-described embodiments, gold is inserted by plating to thereby form the electrically conductive members, but alternatively, selective growth by other method, for example, CVD (chemical vapor deposition) may be effected. The material of the electrically conductive members is not limited to gold, but any other electrically conductive metal or conductive alloy may also be used. Also, polyimide resin is used as the photosensitive resin which provides the holding member, but other any photosensitive resin, such as epoxy resin or silicone resin may also be used. Further, a copper plate is used as the base body; however this is not restrictive, and other metal or alloy may be used. However, in those embodiments wherein only the base body is removed by etching in the final step, it is necessary that the material of the electrically conductive members and the material of the base body be made different from each other.

The electrically conductive members need not be vertically disposed in the holding member, but may be oblique from one surface side to the other surface side of the holding member.

Of course, a similar effect will be obtained even if recesses and through-holes are mixedly formed in the holding member.

Also, a similar effect will of course be obtained even if recesses and/or through-holes are formed in the gaps between the staggeredly disposed electrically conductive members.

As described in detail above, according to the present invention, there is provided an electrical connecting member capable of connecting electric circuit parts together well and a method of manufacturing the same.

What is claimed is:

1. A method of manufacturing an electrical connecting member having a holding member formed of an electrically insulative materials and a plurality of electrically conductive members provided in a mutually insulated state in the holding member, one end of each of the electrically conductive members being exposed on one surface of the holding member and the other end of each of the electrically conductive members being exposed on the other surface of the holding member, said method comprising the steps of:

providing photosensitive resin as the holding member on a base body;

exposing the photosensitive resin to light by the use of a mask provided with light intercepting portions, light transmitting portions and light attenuating portions;

developing the exposed photosensitive resin to thereby form apertures in which portions of the base body are exposed in the photosensitive resin and concave holes;

removing the portions of the base body exposed in the apertures by etching to thereby form recesses;

filling the apertures and the recesses with a material for the electrically conductive members and leaving the concave holes empty; and removing the base body.

2. A method according to claim 1, further comprising the step of disposing the electrically conductive members in a staggered fashion on the surface of the holding member.

3. A method according to claim 1, further comprising the step of forming a wiring pattern on one or each of the surfaces of the holding member.

4. A method according to claim 1, wherein the electrically conductive members comprise electrical connecting portions, and further comprising the step of metallurgically connecting these electrical connecting portions to electric circuit parts.

5. A method according to claim 1, wherein the holding member is resin having its hardness varied by the application of light thereto.

6. A method of manufacturing an electrical connecting member having a holding member formed of an electrically insulative material, and a plurality of electrically conductive members provided in a mutually insulated state in the holding member, one end of each of the electrically conductive members being exposed on one surface of the holding member and the other end of each of the electrically conductive members being exposed on the other surface of the holding member, said method comprising the steps of:

providing photosensitive resin as the holding member on a base body;

exposing the photosensitive resin to light by the use of a mask provided with light intercepting portions, light transmitting portions and light attenuating portions;

developing the exposed photosensitive resin to thereby form apertures in which portions of the base body are exposed in the photosensitive resin and through-holes;

removing the portions of the base body exposed in the apertures by etching to thereby form recesses;

filling the apertures and the recesses with a material for the electrically conductive members and leaving the through-holes empty; and removing the base body.

7. A method according to claim 6, further comprising the step of disposing the electrically conductive members in a staggered fashion on the surface of the holding member.

8. A method according to claim 6, further comprising the step of forming a wiring pattern on one or each of the surfaces of the holding member.

9. A method according to claim 6, wherein electrically conductive members comprise electrical connecting portions, and further comprising the step of metallurgically connecting these electrical connecting portions to electric circuit parts.

10. A method according to claim 6, wherein the holding member is resin having its hardness varied by the application of light thereto.

* * * * *

UNITED STATES PATENT AND TRADEMARK OFFICE
CERTIFICATE OF CORRECTION

PATENT NO. : 5,600,884
DATED : February 11, 1997
INVENTOR(S) : Kondo et al.

It is certified that error appears in the above-indentified patent and that said Letters Patent is hereby corrected as shown below:

COLUMN 2:

Line 10, "each the" should read --each--.

COLUMN 7:

Line 23, "and" should read --and is--.

COLUMN 8:

Line 40, "regists 312" should read --resists 312--.

COLUMN 11:

Line 34, "materials" should read --material,--.

Signed and Sealed this

Nineteenth Day of August, 1997

Attest:

BRUCE LEHMAN

Attesting Officer

Commissioner of Patents and Trademarks